(12) United States Patent
Yu

(10) Patent No.: US 6,284,672 B1
(45) Date of Patent: Sep. 4, 2001

(54) METHOD OF FORMING A SUPER-SHALLOW AMORPHOUS LAYER IN SILICON

(75) Inventor: Bin Yu, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/260,255

(22) Filed: Mar. 2, 1999

(51) Int. Cl.[7] ................................................ H01L 21/302
(52) U.S. Cl. ........................ 438/745; 438/752; 438/753
(58) Field of Search ............................ 438/745, 753, 438/752

(56) References Cited

U.S. PATENT DOCUMENTS

| | | | |
|---|---|---|---|
| 4,682,404 | * 7/1987 | Miller et al. | 29/571 |
| 5,144,403 | * 9/1992 | Chiang et al. | 357/49 |
| 5,148,252 | * 9/1992 | Taka | 357/34 |
| 5,434,440 | * 7/1995 | Yoshitomi et al. | 257/344 |
| 5,493,140 | * 2/1996 | Iguchi | 257/316 |
| 5,698,881 | * 12/1997 | Yoshitomi et al. | 257/344 |
| 5,843,820 | * 12/1998 | Lu | 438/243 |
| 5,953,615 | * 9/1999 | Yu | 438/303 |
| 6,001,706 | * 12/1999 | Tan et al. | 438/424 |

OTHER PUBLICATIONS

Wolf, S., "Silicon Processing for the VLSI Era" vol. 3, Lattice Press, pp. 332–337, 1995.*
Wolf, S. and Tauber, R.N., Silicon Processing for the VLSI Era, vol. 1, 1986, p. 198.*

* cited by examiner

Primary Examiner—Benjamin L. Utech
(74) Attorney, Agent, or Firm—Foley & Lardner

(57) ABSTRACT

A method of manufacturing an integrated circuit is disclosed herein. The method includes providing an implant in a semiconductor to create an amorphous region; growing a thermal oxide layer on the amorphous region such that the thermal oxide layer consumes a portion of the amorphous region; and removing the thermal oxide layer such that the resulting amorphous region is super-shallow.

20 Claims, 2 Drawing Sheets

METHOD OF FORMING A SUPER-SHALLOW AMORPHOUS LAYER IN SILICON

FIELD OF THE INVENTION

The present invention is related to integrated circuit (IC) devices and processes of making IC devices. More particularly, the present invention relates to a method of forming a super-shallow amorphous layer or region in silicon.

BACKGROUND OF THE INVENTION

Integrated circuits (ICs) include a multitude of transistors formed on a semiconductor substrate. Transistors, such as, metal oxide semiconductor field effect transistors (MOSFETs), are generally built on the top surface of a bulk substrate. The substrate is doped to form impurity diffusion layers (i.e. source and drain regions). A conductive layer is situated between the source and drain regions; the conductive layer operates as a gate for the transistor. The gate controls current in a channel between the source and the drain regions.

In the fabrication process, a gate length below 100 nm often requires a super-shallow (<20 nm) junction (i.e. junction between the source and the channel and the junction between the drain and the channel). With the source/drain junction depth reduced, the lateral dopant diffusion under the gate becomes smaller. As such, smaller gate-to-channel overlap capacitance is achieved for a fixed gate length, which is beneficial to fast transistor switching speed. Shallow source/drain junction can also effectively suppress the sub-surface punchthrough and reduce susceptibility to short-channel effects.

Conventional fabrication processes use a pre-amorphization implant, such as $Si^+$ or $Ge^+$, for the fabrication of an ultra-shallow source/drain junction. Providing the pre-amorphization implant before the regular dopant implant (to form source and drain regions) creates a shallow amorphous layer or region near the silicon surface. The pre-amorphization provides the advantages of (1) effectively preventing the channeling effect associated with ion implantation, (2) reducing the dopant activation temperature (the typical dopant species is activated in amorphous silicon at a temperature >550° C.), and (3) significantly reducing the dopant transient-enhanced-diffusion (TED) effect. Nevertheless, one major limitation of the conventional pre-amorphization implant method is that the ultra-shallow junction is limited by the thinness (or shallowness) of the amorphous layer.

Thus, there is a need for a method of forming a super-shallow amorphous layer in silicon during the fabrication process. Further, there is a need to reduce the quantity of implant needed for creating the amorphous layer. Even further, there is a need for fabricating a transistor with the advantages provided by a super-shallow junction.

SUMMARY OF THE INVENTION

One embodiment of the invention relates to a method of manufacturing an integrated circuit. The method includes providing an implant in a semiconductor to create an amorphous region; growing a thermal oxide layer on the amorphous region such that the thermal oxide layer consumes a portion of the amorphous region; and removing the thermal oxide layer such that the resulting amorphous region is super-shallow.

Another embodiment of the invention relates to a method of forming a super-shallow amorphous region in a semiconductor structure. The method includes amorphosizing the semiconductor structure, creating an amorphous region; growing an insulative layer on the semiconductor structure such that the insulative layer consumes a portion of the amorphous region; and removing the insulative layer such that the resulting amorphous region is super-shallow.

Another embodiment of the invention relates to a method of manufacturing an ultra-large scale integrated circuit including a plurality of transistors. The method includes amorphosizing a semiconductor structure, creating an amorphous layer; forming an oxide structure on the semiconductor structure such that the oxide structure consumes a portion of the amorphous layer; and removing the oxide structure.

BRIEF DESCRIPTION OF THE DRAWINGS

The preferred embodiments of the invention will become more fully understood from the following detailed description, taken in conjunction with the accompanying drawings, wherein like reference numerals denote like elements, in which.

DETAILED DESCRIPTION OF THE PREFERRED EMBODIMENTS

Figure 1:
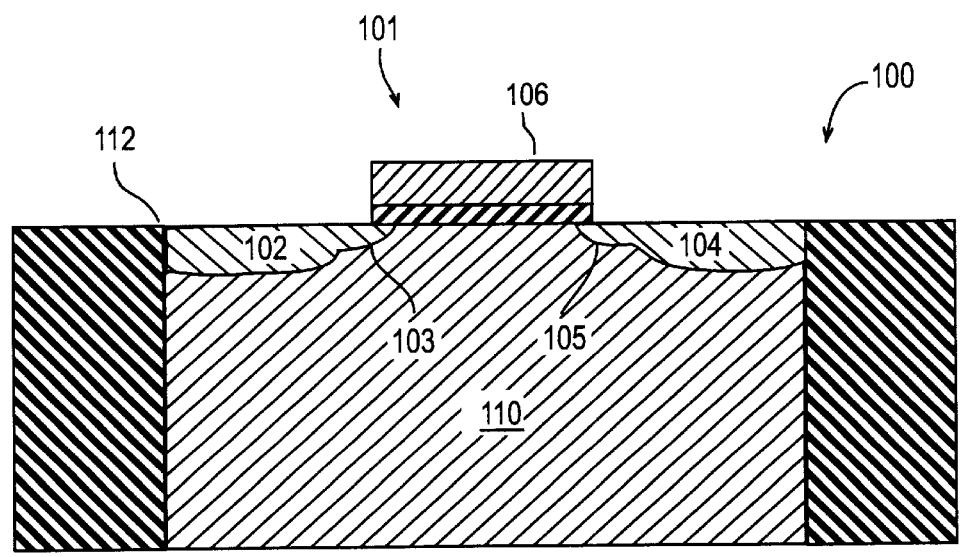
FIG. 1 is a cross-sectional view of a transistor, including a super-shallow junction in accordance with an exemplary embodiment of the present invention.

FIG. 1 illustrates a cross-sectional view of a portion 100 of a base or a substrate 110. Portion 100 includes a transistor 101 fabricated with a source region 102 and a drain region 104, in accordance with the advantageous process described with reference to FIGS. 2–4. Source region 102 and drain region 104 include a super-shallow source extension 103 and a super-shallow drain extension 105. Transistor 101 has a gate length less than 100 nm and is an n-channel or p-channel metal oxide semiconductor field effect transistor (MOSFET).

Regions 102 and 104 are formed by doping amorphous regions in a semiconductor substrate 110 (e.g., single crystal silicon). The amorphous regions utilized for super-shallow source extension 103 and super-shallow drain extension 105 preferably extend only 10–15 nm below a top structure 112 of substrate 110. The amorphous regions are thinned by forming an insulative structure and removing the insulative structure as described with reference to FIGS. 2–4.

After the amorphous regions are formed, the amorphous regions are doped to form extension 103 of source region 102 and an extension 105 of drain region 104. Regions 102 and 104 can be doped with P, B, $BF_2$, As, or other dopant. Regions 102 and 104 are doped to a concentration of $10^{17}$–$10^{19}$ dopants/$cm^3$. After doping, substrate 110 is subjected to a rapid thermal anneal (RTA). The RTA activates the dopants in regions 102 and 104 and transforms the amorphous region to polycrystalline.

A gate stack 106 can be can be formed before or after source 102 and drain 104 are formed in accordance with conventional CMOS fabrication processes. Also, connections, isolations regions, vias, and other structures for transistor 102 can be formed according to conventional CMOS processes.

Figure 2:
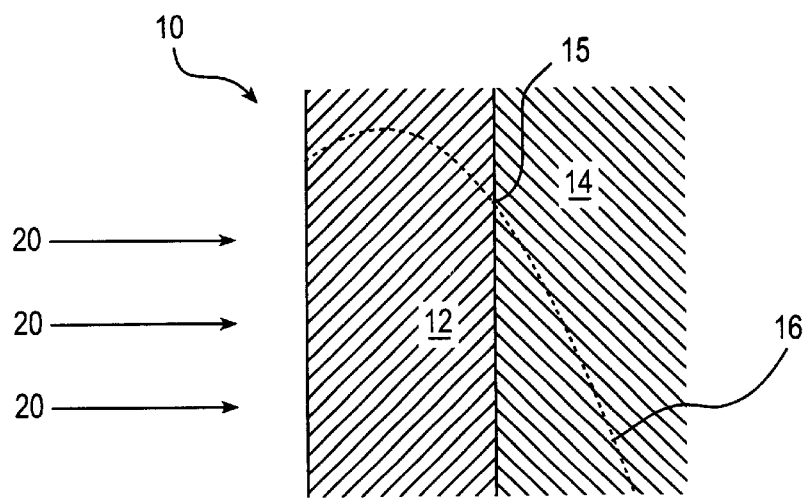
FIG. 2 is a cross-sectional view of a portion of a substrate, including an amorphous region and a semiconductor layer and showing an implantation step to create the amorphous region.

Referring to FIG. 2, a cross-sectional view of a portion 10 of a base layer, substrate, or a semiconductor layer 14 is illustrated in accordance with an exemplary embodiment of the present invention. Layer 14 is preferably part of a single crystal semiconductor wafer, such as a silicon wafer. Alternatively, layer 14 can be a thin film on a semiconductor or an insulator substrate, a silicon thin film on a silicon-on-insulator (SOI) substrate, a gallium arsenide (GaAs) substrate, or other semiconductor material.

Portion 10 also includes an amorphous layer or region 12. A dashed line 16 depicting an implant profile or concentration in amorphous region 12 and layer 14 represents the relative concentration of implantation species or impurities in portion 10. Portion 10 is oriented in FIGS. 2–4 with the surface of portion 10 in a vertical position such that the level of concentration of implantation species is indicated by the vertical height of dashed line 16. Increased concentrations of impurities exist in vertical sections of portion 10 which include higher points of dashed line 16. Similarly, dashed line 16 indicates lower concentrations of impurities in vertical sections of portion 10 which include lower points of dashed line 16. Therefore, as can be seen in FIG. 2, the concentration of impurities in portion 10 is greater in amorphous regions 12 than in layer 14.

In order for amorphous region 12 to be formed a certain minimum concentration of impurities is necessary, and amorphous region 12 will not be formed in sections with concentrations lower than the minimum. A point 15 on dashed line 16 indicates a minimum concentration of impurities at which amorphous region is formed. Region 12 has a concentration above point 15, and layer 14 has a concentration below point 15. Point 15 represents a concentration of $Si^+$ or $Ge^+$ impurities.

Figure 3:
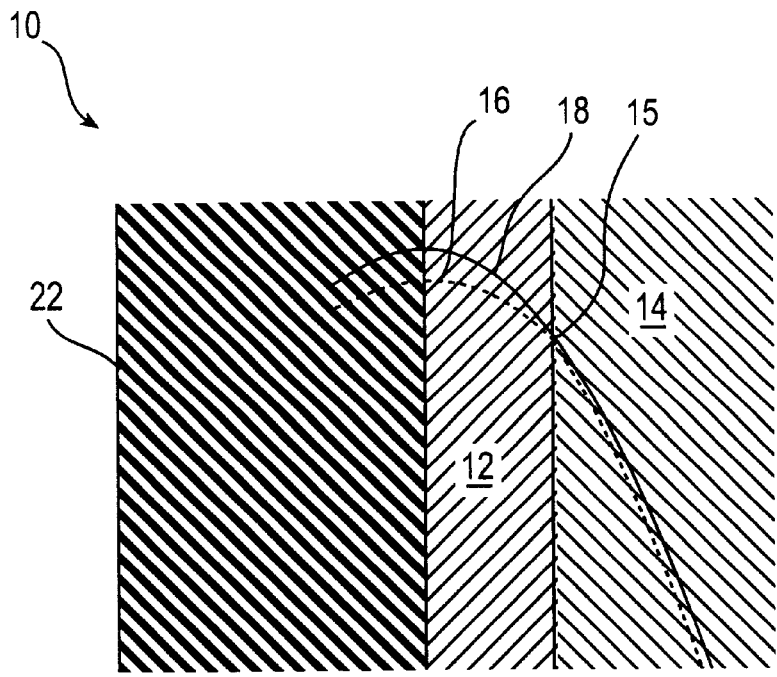
FIG. 3 is a cross-sectional view of the portion of the substrate illustrated in FIG. 2, showing a thermal oxide layer and a resulting shift in an implant profile region.
Figure 4:
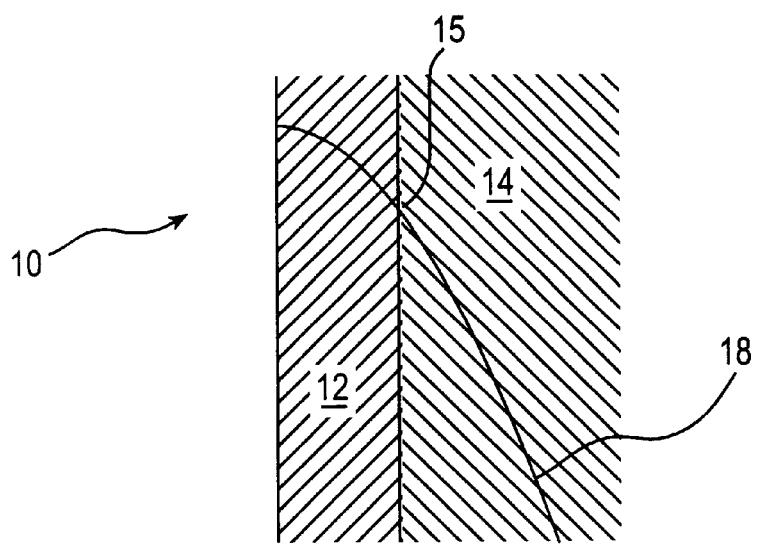
FIG. 4 is a cross-sectional view of the portion of the substrate illustrated in FIG. 2.

With reference to FIGS. 2–4, the fabrication of portion 10 is described below. In FIG. 2, the cross-sectional view of portion 10 illustrates an implantation step to create amorphous region 12. In the implantation step, an implantation species 20 is implanted in layer 14 to create amorphous region 12. Implantation species 20 can be $Si^+$ or $Ge^+$. In an exemplary embodiment, implantation species 20 has a projection of approximately 15–20 nm, resulting in an amorphous region 12 having a thickness of approximately 30–40 nm. Deeper or shallower projections can also be utilized. Implantation species 20 is implanted such that amorphous region 12 lacks a distinct crystalline structure. Layer 14, in contrast, has a distinct crystalline structure.

Implantation of implantation species 20 can be accomplished by any of a variety of implantation devices such as the Varian E220, manufactured by Varian of Palo Alto, Calif. Typically, implantation of ions can be done at approximately 10–100 kiloelectronVolts (keV). Different energy levels are required, depending on the type of substrate and ions used. For example, the energy required to implant into silicon ranges from 20–60 keV and the energy required to implant into germanium ranges from 10–40 keV.

In FIG. 3, a cross-sectional view of portion 10 illustrates a thermal oxide layer 22 and a resulting implant concentration region represented by a solid line 18. In an exemplary embodiment, growing of thermal oxide layer 22 on silicon layer 14 occurs at approximately 800° C. Thermal oxide layer 22 can have a final thickness of approximately 25–55 nm and consumes approximately 15–30 nm (e.g. 55%) of region 12, resulting in a super-shallow amorphous region 12 of approximately 10–15 nm.

The solid line 18 illustrated in FIG. 3 results from a change in the implant profile or concentration for two reasons. First, because thermal oxide layer 22 consumes a portion of region 12, region 12 is made more shallow and the peak of the concentration represented by line 18, is closer to the surface of region 12 (e.g., the interface between amorphous region 12 and oxide layer 22). Second, because implantation species 20 (e.g., $Si^+$ or $Ge^+$) is repelled from (i.e. moves away from) thermal oxide layer 22 (to the right as shown in FIG. 3), more implantation species 20 collects adjacent the surface of region 12, increasing the height of the peak of the concentration. The increased height in the peak indicates an increased relative concentration of implantation species or impurities. The repelling of implantation species 20 from thermal oxide layer 22 to amorphous region 12 is called segregation.

Together, segregation and the consuming of a portion of region 12 by thermal oxide layer 22 result in a change in the height of the implantation or concentration peak and a change in the location of the implant concentration relative to the surface of region 12. This change is illustrated in FIG. 3 by dashed line 16 depicting the pre-oxide profile region and solid line 18 depicting post-oxide profile region. In one embodiment, the change in the implant concentration moves the peak of the concentration closer to the surface of region 12 by approximately 10–15 nm.

The segregation of implantation species 20 from the consumed portion of the amorphous region to the unconsumed portion of the amorphous region during formation of thermal oxide layer 22 reduces the quantity of implantation species 20 needed during creation of the amorphous region. For example, a critical dose of $Ge^+$ for the conventional creation of an amorphous region is approximately $3 \times 10^{14}$ $cm^{-2}$. Due to segregation of implantation species 20 away from thermal oxide layer 22, a lower dose can be used for forming amorphous region 12.

After the growth of thermal oxide layer 22 and the segregation of implantation species 20, thermal oxide layer 22 is removed by chemical wet etching. The chemical wet etching process is selective to silicon oxide with respect to silicon. Referring now to FIG. 4, a cross-sectional view of portion 10 illustrates the remaining super-shallow amorphous layer 12 having a thickness of approximately 10–15 nm after layer 22 is removed. Alternatively, layer 22 can be stripped or removed in a dry etching or other process.

In an alternate embodiment, layer 22 can be a local oxidation of silicon (LOCOS) structure or other insulative structure. In such an embodiment, the LOCOS structure can be grown in accordance with a conventional LOCOS process. Sixty percent (60%) of the structure consumes region 12 of layer 14. Thus, a variety of processes can be utilized to provide controlled thinning of region 12.

It is understood that while the detailed drawings, specific examples, and particular values given provide a preferred exemplary embodiment of the present invention, it is for the purpose of illustration only. The method and apparatus of the invention is not limited to the precise details and conditions disclosed. For example, although particular insulative semiconductor structures are described, other types of insulative semiconductor structures can utilize the principles of the present invention. The invention is not limited to a particular embodiment, but extends to various modifications, combinations, and permutations that nevertheless fall within the scope and spirit of the appended claims.

What is claimed is:

1. A method of manufacturing an integrated circuit comprising:
   providing an implant in a semiconductor to create an amorphous region;
   growing a thermal oxide layer on the amorphous region such that the thermal oxide layer consumes a portion of the amorphous region; and
   removing the thermal oxide layer such that the resulting amorphous region is thinner than when initially created.

2. The method of claim 1, wherein removing the thermal oxide layer is done by wet etching.

3. The method of claim 1, wherein growing the thermal oxide layer on the amorphous region results in segregation of the implant such that the minimum implant dose required for creation of the amorphous region is less than that normally required to create an amorphous region.

4. The method of claim 1, wherein the implant is $Ge^+$.

5. The method of claim 1, wherein the implant is $Si^+$.

6. The method of claim 1, wherein removing the thermal oxide layer results in a high concentration of implant proximate to an edge of the amorphous region.

7. The method of claim 1, wherein the thickness of the amorphous region is substantially equal to 30–40 nm.

8. The method of claim 1, wherein growing a thermal oxide layer increases the relative concentration of the implant material in the amorphous region and changes the implant profile relative to the surface.

9. The method of claim 1, wherein the resulting amorphous region is substantially equal to 10–15 nm.

10. The method of claim 1, wherein providing the implant into the amorphous region has a projection implantation depth which is substantially equal to 15–20 nm.

11. A method of forming a super-shallow amorphous region in a semiconductor structure, the method comprising:
    amorphosizing the semiconductor structure, creating an amorphous region;
    growing an insulative layer on the semiconductor structure such that the insulative layer consumes a portion of the amorphous region; and
    removing the insulative layer such that the resulting amorphous region is thinner than when initially created.

12. The method of claim 11, wherein removing the insulative layer is done by wet etching.

13. The method of claim 11, wherein amorphosizing includes implanting an implantation material in the silicon structure.

14. The method of claim 13, wherein the implantation material is silicon.

15. The method of claim 11, wherein growing an insulative layer on the semiconductor structure results in segregation of the implant such that the minimum implant dose required for creation of the amorphous region is less than that normally required to create an amorphous region.

16. The method of claim 11, wherein growing an insulative layer results in a high concentration of implant in the amorphous region at the surface of the amorphous region.

17. A method of manufacturing an ultra-large scale integrated circuit including a plurality of transistors, the method comprising:
    amorphosizing a semiconductor structure, creating an amorphous region;
    forming an oxide structure on the semiconductor structure such that the oxide structure consumes a portion of the amorphous region; and
    removing the oxide structure.

18. The method of claim 17, wherein amorphosizing includes the implantation of a material in the semiconductor structure.

19. The method of claim 18, wherein the material is silicon.

20. The method of claim 17, wherein forming an oxide structure on the semiconductor structure results in segregation of the implant such that the minimum implant dose required for creation of the amorphous region is less than that normally required to create an amorphous region.

* * * * *